(12) United States Patent
Shiozawa et al.

(10) Patent No.: US 6,638,785 B2
(45) Date of Patent: Oct. 28, 2003

(54) ADSORBING DEVICE, SUCKER AND MOUNTING DEVICE FOR CONDUCTIVE MEMBER, ADSORBING METHOD AND MOUNTING METHOD FOR CONDUCTIVE MEMBER, AND SEMICONDUCTOR DEVICE AND METHOD OF MAKING

(75) Inventors: Masakuni Shiozawa, Suwa (JP); Tomoyuki Shindo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/314,141

(22) Filed: Dec. 9, 2002

(65) Prior Publication Data

US 2003/0080424 A1 May 1, 2003

Related U.S. Application Data

(62) Division of application No. 09/592,570, filed on Jun. 12, 2000, now Pat. No. 6,512,294.

(30) Foreign Application Priority Data

Jun. 14, 1999 (JP) .............................. 11-166942
Jun. 14, 1999 (JP) .............................. 11-166943
May 15, 2000 (JP) ........................... 2000-141199

(51) Int. Cl.[7] .............................................. H01L 21/00
(52) U.S. Cl. ....................................................... 438/51
(58) Field of Search ............................. 438/51, 55, 64

(56) References Cited

U.S. PATENT DOCUMENTS

| 5,284,287 A | | 2/1994 | Wilson et al. | ........... 228/180.2 |
|---|---|---|---|---|
| 5,749,614 A | | 5/1998 | Reid et al. | ................. 294/64.1 |
| 5,867,260 A | * | 2/1999 | Sakai | .......................... 356/237 |
| 6,146,920 A | | 11/2000 | Inoue et al. | ................. 438/113 |
| 6,158,649 A | | 12/2000 | Miura | ......................... 228/246 |
| 6,176,008 B1 | | 1/2001 | Ueoka | ........................... 29/743 |
| 6,260,259 B1 | * | 7/2001 | Kajii | ............................. 29/714 |
| 6,460,755 B1 | * | 10/2002 | Inoue et al. | ................. 228/246 |

FOREIGN PATENT DOCUMENTS

JP    A 8-153960    6/1996

* cited by examiner

*Primary Examiner*—David Nelms
*Assistant Examiner*—Quoc Hoang
(74) *Attorney, Agent, or Firm*—Oliff & Berridge, PLC

(57) ABSTRACT

A conductive-member adsorbing device has an adsorber having adsorption portions for adsorbing conductive members and a force supply unit. The force supply unit is operative to apply a force which can maintain one conductive member adsorbed by one adsorption portion, but can release two conductive members adsorbed by one adsorption portion.

9 Claims, 14 Drawing Sheets

F I G. 1 2
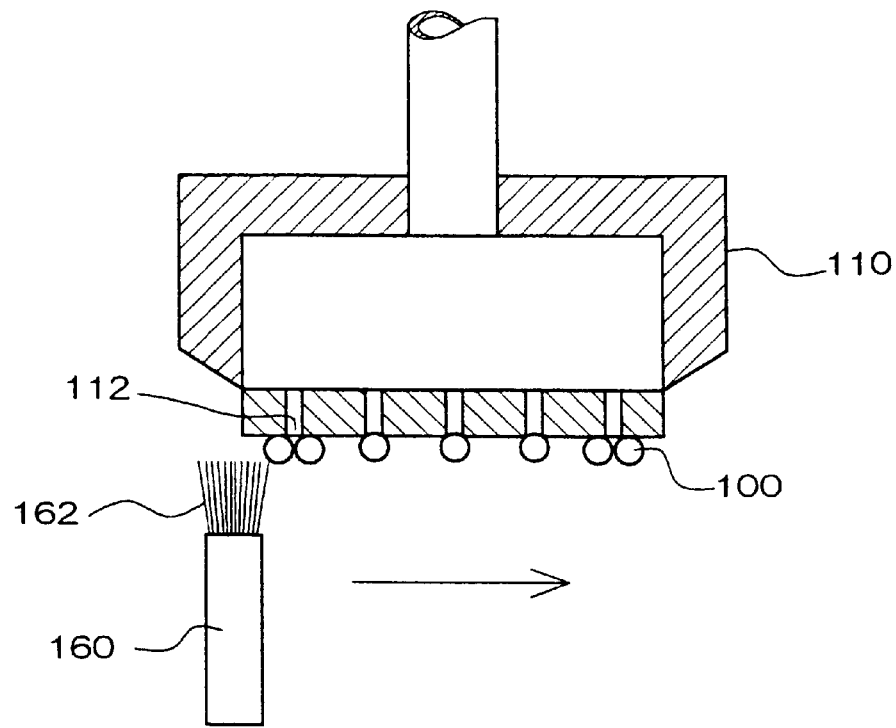
F I G. 1 3
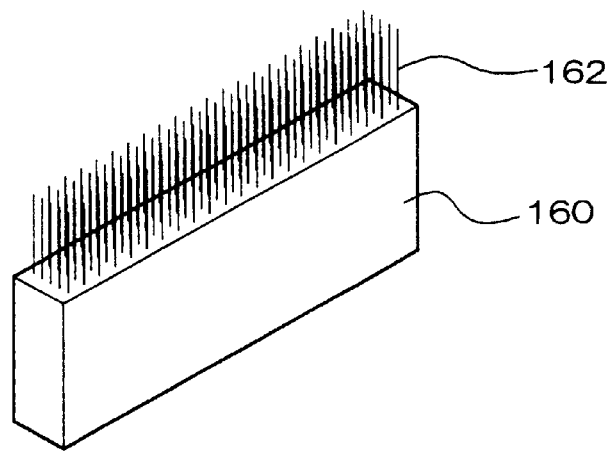

ADSORBING DEVICE, SUCKER AND MOUNTING DEVICE FOR CONDUCTIVE MEMBER, ADSORBING METHOD AND MOUNTING METHOD FOR CONDUCTIVE MEMBER, AND SEMICONDUCTOR DEVICE AND METHOD OF MAKING

This is a Division of application Ser. No. 09/592,570 filed Jun. 12, 2000 now U.S. Pat. No. 6,512,294. The entire, disclosure of the prior application is hereby incorporated by reference herein in its entirety.

BACKGROUND OF THE INVENTION

1. Field of the Invention

The present invention relates to adsorbing device, adsorber, mounting device for a conductive member, adsorbing method and mounting method for a conductive member, semiconductor device and method of making the same.

2. Description of Related Art

In an process of assembling a semiconductor device to which BGA (Ball Grid Array), CSP (Chip Scale/Size Package) or the like is applied, a solder ball is mounted on the semiconductor device at an electrode forming location as a conductive member.

FIG. 23 is a perspective view schematically illustrating the structure of a solder-ball mounting device according to the prior art. The solder-ball mounting device comprises a vacuum chuck stage 10 for causing a mount head 50 to adsorb solder balls 54 (see FIG. 24), a missing-ball detection lamp 20 and double-ball detection laser receiving and emitting units 30, which are used to check whether or not the solder balls 54 have properly been adsorbed by the mount head 50, a ball ejecting stage 40 for ejecting any solder ball 54 when it has not properly been adsorbed by the mount head 50, and a mount stage 60 for mounting solder balls 54 adsorbed by the mount head 50 on a substrate at electrode forming locations.

In such a solder-ball mounting device, the solder balls 54 have been contained within a container on the vacuum chuck stage 10. The mount head 50 is then inserted into this container. When the solder balls 54 are blown up from the container, the mount head 50 adsorbs the solder balls through the adsorption holes thereof.

More particularly, the mount head 50 has such a structure as shown in FIGS. 24 and 25. The mount head includes a main body 51 having an adsorption member 53 that is mounted on the bottom thereof. This adsorption member 53 includes a plurality of adsorption holes 70 formed therethrough. Each of the adsorption holes 70 is designed to adsorb one solder ball 54.

The main mount head body 51 also includes a tube 52 connected to the top thereof. The tube 52 is then connected to a vacuum source (not shown). When the solder balls 54 are blown up from the container and reach near the adsorption member 53 on the mount head 50, they will be attracted to and adsorbed by the adsorption holes 70 under the action of vacuum.

Subsequently, it is checked whether or not the solder balls 54 are properly adsorbed by the mount head 50. There are two wrong manners in which the solder balls 54 are improperly adsorbed by the mount head 50. In one wrong manner, a plurality of solder balls 54 is adsorbed by a single adsorption hole 71, as shown in FIG. 24. This will be referred to "double-ball state". In the other wrong manner, there is an adsorption hole 72 having no adsorbed solder ball 54, as shown in FIG. 25. In other words, the adsorption member 54 does not have a predetermined number of adsorbed solder balls 54. This will be referred to "missing state".

FIG. 26 shows the relationship between the height of the mount head 50 (or the distance between the mount head 50 and the container) and the number of errors (or the number of re-adsorptions for solder balls improperly adsorbed by the adsorption holes). As shown in FIG. 26, the double-ball and missing states are contrary to each other. Considering both the double-ball state (D) and missing state (M), therefore, only a very narrow single-hatched range X can be utilized to reduce the number of errors (or production margin).

When the mount head 50 has moved to the position in which the missing-ball detection lamp 20 and double-ball detection laser receiving and emitting units 30 are located through any not-shown moving means, the mount head 50 may be irradiated by the missing-ball detection lamp 20 to detect any missing state. Any double-ball state in the mount head may be detected by the double-ball detection laser receiving and emitting units 30.

More particularly, a camera or the like may be used to monitor the solder balls 54 irradiated by the missing-ball detection lamp 20 for detecting the missing state. The double-ball detection laser is also emitted slightly below one solder ball 54 and received by the light-receiving unit. If there is a double-ball state, the lower solder ball 54 will block the laser beam. This permits the double-ball state to be detected.

If a double-ball state is detected, all the solder balls 54 are removed from the adsorption member on the mount head 50 by breaking the vacuum at the ball ejecting stage 40. Thereafter, the solder balls 54 will again be adsorbed by the adsorption member at the adsorption stage 10. Thus, it is established that a solder ball 54 is adsorbed by each of all the adsorption holes 70 in the adsorption member 53.

While maintaining such a situation, the mount head 50 is moved to the mounting stage 60 wherein the solder balls 54 are mounted on the substrate at electrode forming locations for electrical components.

In the above-mentioned process of mounting the solder balls, however, all the solder ball 54 already mounted must be removed to perform the re-adsorption when the double-ball state occurs. This raises a problem in productivity.

SUMMARY OF THE INVENTION

In order to overcome this problem, an object of the present invention is to provide an adsorbing device, adsorber, mounting device for a conductive member, adsorbing method and mounting method for a conductive member, semiconductor device and method of making the same which can effectively adsorb conductive members.

(1) A conductive-member adsorbing device according to a first aspect of the present invention comprises: an adsorber having a plurality of adsorption portions for adsorbing a plurality of conductive members, each of the adsorption portions creating an adsorption force that exceeds a force required to adsorb at least one of the conductive members being a predetermined number to be adsorbed by each of the adsorption portions; and a force supply unit for applying a force capable of maintaining an adsorbed state of the at least one conductive member being the predetermined number to be adsorbed by each of the adsorption portions, and capable of releasing at least one of the conductive members when a number of the conductive members adsorbed by one of the adsorption portions exceeds the predetermined number.

According to this aspect of the present invention, each of the adsorption portions can create an adsorption force exceeding a force adsorbing the at least one conductive member being the predetermined number. Thus, the at least one conductive member being the predetermined number can be adsorbed with a margin. Even if a number of the conductive members adsorbed by one of the adsorption portions exceeds, the force-supply unit can release at least one of these adsorbed conductive members. The force applied by the force supply unit maintains the at least one conductive member being the predetermined number adsorbed by one of the adsorption portions. Excessive conductive members adsorbed by the one adsorption portion can be removed while maintaining one conductive members adsorbed by the one adsorption portion. Therefore, it is not necessary to remove all the adsorbed conductive members from the adsorption member if the conductive members have improperly been adsorbed by the adsorption member. This provides an efficient adsorption.

(2) In the conductive-member adsorbing device, one of the conductive members may be predetermined to be adsorbed by each of the adsorption portions. Thus, one conductive member can only be adsorbed by one adsorption portion.

(3) In the conductive-member adsorbing device, a first adsorption direction in which the at least one conductive member being the predetermined number is adsorbed by one of the adsorption portions may be different from a second adsorption direction in which a number of the conductive members adsorbed by one of the adsorption portions exceeds the predetermined number; and the force supply unit applies the force in the substantially same direction as the first adsorption direction so that at least one of the conductive members may be removed by applying a force to the conductive members adsorbed by one of the adsorption portions exceeding the predetermined number in a direction different from the second adsorption direction.

A direction in which one conductive members is to be adsorbed (first adsorption direction) is different from a direction in which a number of the conductive members adsorbed by one of the adsorption portions exceeds the predetermined number (second adsorption direction). Thus, the force supply unit will apply a force to the adsorbed conductive members of which number exceeds the predetermined number, in a direction different from the second adsorption direction by applying a force in the first adsorption direction. As a result, at least one of the conductive members can be removed from the adsorption portion.

(4) In the conductive-member adsorbing device, the force supply unit may apply the force by blowing a gas against the conductive members adsorbed by the adsorption portion.

Thus, the force applied to the conductive members may not be a mechanically contacting force.

(5) In the conductive-member adsorbing device, the force supply unit may blow the gas instantaneously.

Thus, the blast of gas can provide an impulse of force. This can accomplish the same advantage without need of an increased force.

(6) In the conductive-member adsorbing device, the force supply unit may apply the force by contacting the conductive members adsorbed by the adsorption portion.

(7) In the conductive-member adsorbing device, the force supply unit may contact the conductive members without charging any static electricity.

Thus, it can be avoided that the conductive members are attracted to the force supply unit under the action of static electricity.

(8) In the conductive-member adsorbing device, the force supply unit may only contact a portion of each of the conductive members opposite to a portion adsorbed by each of the adsorption portions.

(9) According to a second aspect of the present invention, a conductive-member adsorber comprises a receiver having an inlet port for gas, the receiver being configured to receive at least one conductive member being a predetermined number to be received by the receiver, and the adsorber includes an uneven portion for providing a flow path of the gas to the inlet port, the uneven portion being formed outside the receiver.

According to the present invention, each of the conductive members can be adsorbed by the receiver when the interior of the gas inlet port is in vacuum. Since the uneven portion is formed around the receiver, the flow path of gas can be ensured below the conductive members even though a certain number of conductive members are attracted to the outside of the receiver. This makes the adsorption of conductive members difficult under leakage of the gas. Therefore, any conductive member will not be adsorbed outside of a receiver although any conductive member can be adsorbed within the receiver. Since in such a manner, a number of conductive members adsorbed by one receiver will not exceed the predetermined number, it is not required that all the adsorbed conductive members are removed or released as in the prior art. This makes the adsorption effective.

(10) In this adsorber, the receiver may be configured to contact the at least one conductive member so that the at least one conductive member covers the inlet port.

This provides an effective adsorption of conductive members.

(11) In this adsorber, the uneven portion may be formed by a groove leading to the receiver.

(12) In this adsorber, the groove may have a bottom larger than an opening thereof.

Thus, the leakage of gas can be increased.

(13) In this adsorber, the uneven portion may be formed by a projection.

(14) In the adsorber, the uneven portion may be formed by a roughened surface in which the receiver is formed.

(15) A third aspect of the present invention provides a conductive-member mounting device comprising the above-described conductive-member adsorbing device, and the adsorber may have a function of mounting the conductive members on an object.

According to this aspect of the present invention, the conductive members can be mounted on the object while the adsorber is adsorbing the conductive members.

(16) A fourth aspect of the present invention provides a conductive-member mounting device comprising the above-described conductive-member adsorber, and the adsorber may have a function of mounting the conductive members on an object.

(17) A fifth aspect of the present invention provides a conductive-member adsorbing method, comprising a step of adsorbing a plurality of conductive members by a plurality of adsorption portions and applying a force to the adsorbed conductive members to remove at least one of the conductive members which exceeds a predetermined number to be adsorbed by each of the adsorption portions, and the force is capable of maintaining an adsorbed state of the at least one conductive member being the predetermined number to be adsorbed by each of the adsorption portions, and capable of releasing at least one of the conductive members when a number of the conductive members adsorbed by one of the adsorption portions exceeds the predetermined number; and each of the adsorption portions adsorbs at least one of the conductive members without exceeding the predetermined number.

According to this aspect of the present invention, at least one of the conductive members can be released by applying the force even if a number of the conductive members adsorbed by one of the adsorption portions exceeds the predetermined number. When one conductive member is being adsorbed by one of the adsorption portions, such a state can be maintained. Thus, excessive conductive members adsorbed by one adsorption portion can be removed while maintaining one conductive member adsorbed by another adsorption portion. Therefore, it is not required that all the adsorbed conductive members are removed. This enables an effective adsorption.

(18) In this adsorption method, after the step of removing the at least one exceeded conductive member, the step of adsorbing a plurality of conductive members by a plurality of adsorption portions may be repeated when a number of the adsorbed conductive members by each of the adsorption portions is smaller than the predetermined number.

Thus, the proper number of conductive members can be adsorbed.

(19) A conductive-member adsorbing method as a sixth aspect of the present invention comprises a step of adsorbing at least one conductive member by a receiver having an inlet port for gas, the receiver being formed to receive the conductive member that is a predetermined number to be received by the receiver, and an uneven portion is formed around outside the receiver; the conductive member disposed within the receiver prevents the gas from leaking into the inlet port to create a negative pressure within the inlet port, thus adsorbing the disposed conductive member; and the gas is leaked to an under portion of the conductive member through the uneven portion, outside the receiver, to prevent the conductive member from being adsorbed.

According to this aspect of the present invention, each of the conductive members can be adsorbed at the receiver under the action of vacuum within the inlet port. Since the uneven portion is formed outside of the receiver, the flow path of gas can be formed below the conductive members even if a certain number of conductive members are gathered to the outside of the receiver. Thus, the gas can leak to make the adsorption of conductive member difficult. As a result, any conductive member will not be adsorbed outside of the receiver although the conductive member within that receiver can properly be adsorbed. In other words, excessive conductive members will not be adsorbed. It is thus not required that all the conductive members adsorbed are released. This provides an effective adsorption.

(20) A seventh aspect of the present invention provides a conductive-member mounting method, comprising a step of adsorbing the conductive members according to the above-described method and mounting the adsorbed conductive members on an object.

According to this aspect of the present invention, the conductive member can be mounted on the object while adsorbing it.

(21) An eighth aspect of the present invention provides a conductive-member mounting method, comprising a step of adsorbing the conductive members according to the above-described method and mounting the adsorbed conductive members on an object.

According to this aspect of the present invention, the conductive members can be mounted on the object while adsorbing them.

(22) A ninth aspect of the present invention provides a method of making a semiconductor device, comprising a step of adsorbing the conductive members according to the above-described method and mounting the adsorbed conductive members on a component.

According to this aspect of the present invention, the semiconductor device can be made by mounting the conductive member on the component while adsorbing it.

(23) A tenth aspect of the present invention provides a method of making a semiconductor device, comprising a step of adsorbing the conductive members according to the above-described method and mounting the adsorbed conductive members on a component.

According to this aspect the present invention, the semiconductor device can be made by mounting the conductive members on the component while adsorbing them.

(24) A eleventh aspect of the present invention provides a semiconductor device manufactured according to the above-described method.

BRIEF DESCRIPTION OF THE DRAWINGS

FIG. 12 illustrates a conductive-member adsorbing device constructed according to a second embodiment of the present invention;

FIG. 13 illustrates a force supply unit in the second embodiment;

DETAILED DESCRIPTION OF THE PREFERRED EMBODIMENTS

Several preferred embodiments of the present invention will now be described with reference to the drawings.

First Embodiment

Figure 1:
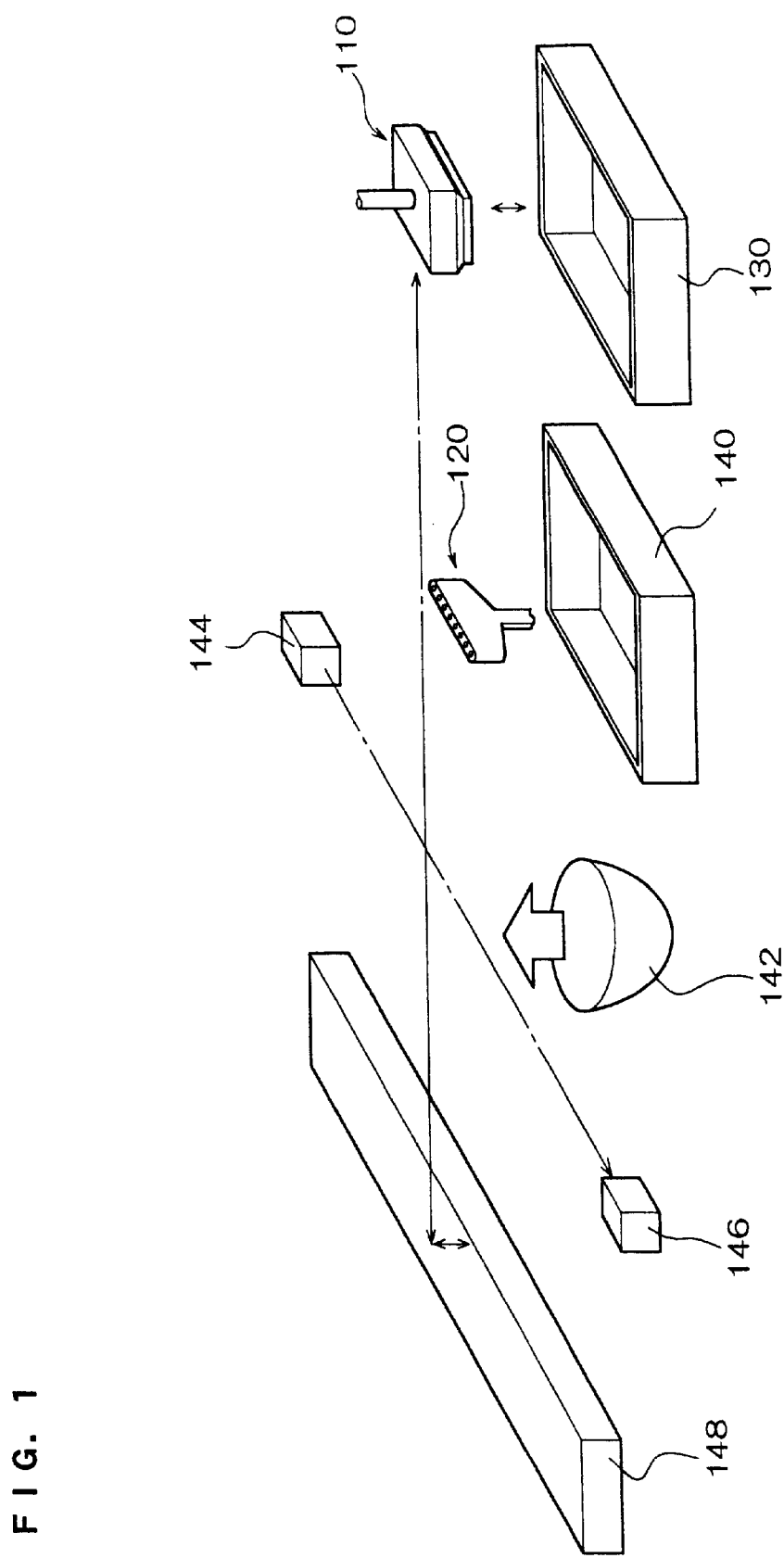
FIG. 1 illustrates a conductive-member mounting device constructed according to a first embodiment of the present invention.

FIG. 1 illustrates a conductive-member mounting device constructed according to the first embodiment of the present invention. The conductive-member mounting device comprises a conductive-member adsorbing device which includes an adsorber 110 and a force supply unit 120. The adsorber 110 has a function as a mounting unit for conductive members and thus serves as an adsorbing/mounting unit (or mount head).

Figure 2:
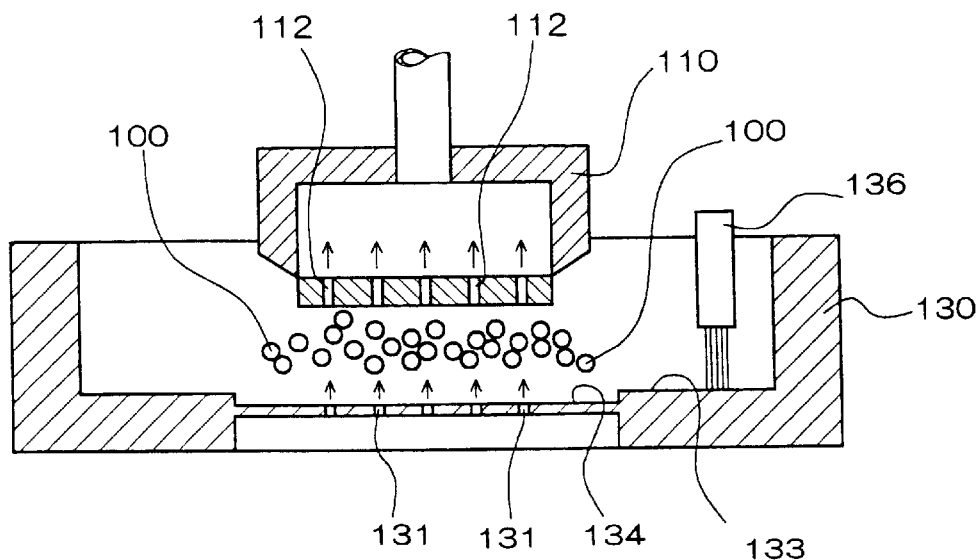
FIG. 2 illustrates an adsorber in the first embodiment.

FIG. 2 illustrates the adsorber 110 which has a plurality of adsorption portions 112 for adsorbing a plurality of conductive members 100. Each of the adsorption portions 112 is designed to adsorb at least one conductive member 100 being the predetermined number to be adsorbed by each of the adsorption portions. Each of the adsorption portions 112 may create an adsorption force larger than a force sufficient to adsorb at least one conductive member 100 being the predetermined number, for providing an adsorption margin.

In the first embodiment, each of the adsorption portions is in the form of a through-hole 112 which leads to a vacuum source such as a vacuum pump (not shown). When each of the through-hole (or adsorption portion 112) is in vacuum, at least one conductive member 100 being the predetermined number will be attracted to and adsorbed by the through-hole. The adsorber 110 shown in FIG. 2 includes a member of downward directed C-shaped configuration (or main mount head body), which member includes a plate-like member (or adsorption member) mounted on the downward directed opening of the main mount head body. The adsorption member includes a plurality of through-holes (or adsorption portions 112) formed therethrough. The top of the C-shaped member is connected to a tube which is in turn connected to the vacuum source (not shown).

The conductive-member mounting device shown in FIG. 1 may include a container 130 for containing conductive members. FIG. 2 also shows the container 130. The container 130 is designed to contain a plurality of conductive members 100. The conductive members are formed by a conductive material and in the form of balls such as solder balls. The conductive members may be in the form of rectangular parallelepiped or other.

The container 130 may be constructed to float the conductive members upward. For example, the bottom wall of the container 130 may be formed with through-holes 131 which lead to a gas supply (not shown). These through-holes 131 may correspond to the respective through-holes 112 in the adsorber 110 with one to one. Thus, one conductive member upward floated from one through-hole 131 in the container 130 can easily be adsorbed by one adsorption portion 112. If the number of the through-holes 131 is smaller than that of the adsorption portions 112, it is preferred that the through-holes 131 are substantially equidistantly formed to move the conductive members 100 toward all the adsorption portions 112. Alternatively, the number of the through-holes 131 may be larger than that of the adsorption portions 112. It may further be considered that at least a portion of the bottom wall in the container 130 is formed into a meshed configuration.

As shown in FIG. 2, the bottom of the container 130 may be stepped to provide a raised bottom face 133 and a recessed bottom face 134. Thus, a plurality of conductive members 100 can be collected into a portion of the container 130 (or the recessed bottom face 134 thereof). In such a case, the recessed bottom face 134 is formed to have through-holes 131 or into a meshed configuration. The conductive members 100 may be collected into a flat plane (or non-overlap). More particularly, a squeegee 136 may be moved parallel to the bottom face of the container 130 so that the conductive members 100 will be collected onto the recessed bottom face 134 in a flat configuration. Thus, the conductive members 100 can more easily be floated upward.

The conductive members (or solder balls) 100 are upward floated by the gas supplied from the gas supply (not shown) and attracted and adsorbed to the adsorption portions 112 in the adsorber 110.

Figure 3:
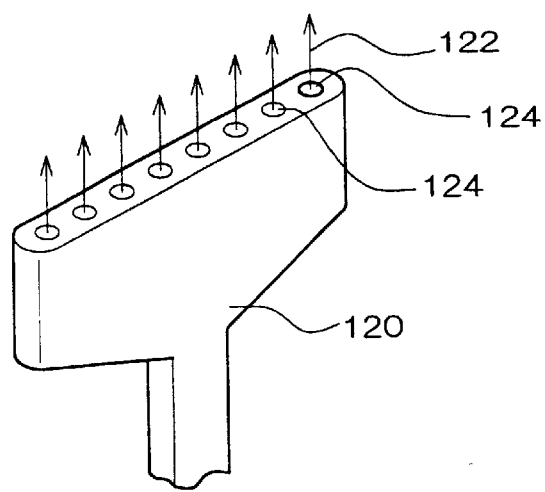
FIG. 3 illustrates a force supply unit in the first embodiment.
Figure 4:
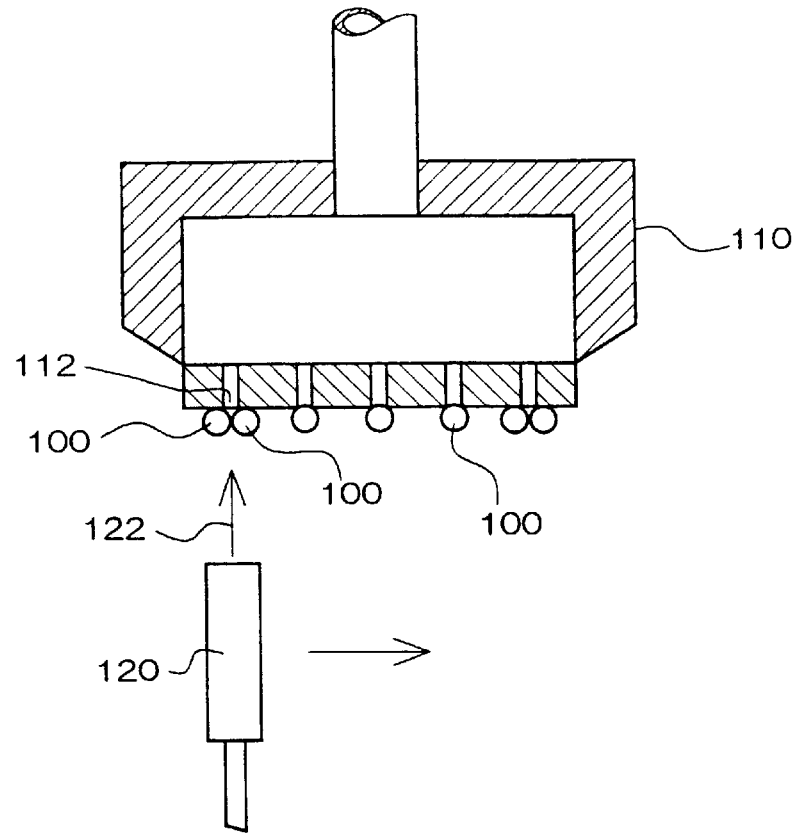
FIG. 4 illustrates a conductive-member adsorbing device according to the first embodiment.

FIG. 3 shows the force supply unit 120 which is designed to apply a force to the conductive members 100 adsorbed by an adsorption portion 112, as shown in FIG. 4. In the first embodiment, the force supply unit 120 is designed to blow a flow of gas 122 against the conductive members 100. More particularly, force supply unit 120 includes a plurality of apertures 124 formed therein, which apertures 124 are connected to a source of compressed gas such as a compressor (not shown).

In FIG. 3, the apertures 124 is arranged in a linear line, but may be formed with the same number and spacing as in the adsorption portions 112. Alternatively, the number of the apertures 124 may be smaller than that of the adsorption portions 112 and the spacing between adjacent apertures 124 may be larger than that of the adsorption portions 112 or vice versa. If the apertures 124 is arranged in a linear line, at least one of the force supply unit 120 and adsorber 110 is moved in a direction perpendicular to the line of apertures 124, as shown in FIG. 4. Thus, the force can be applied from the force supply unit 120 to all the adsorption portions 112.

Alternatively, the apertures 124 are provided in plural rows and columns so that the force can simultaneously be applied to all the adsorption portions 112. If the force supply unit 120 has only one aperture 124, at least one of the force supply unit 120 and adsorber 110 may be moved relative to the aperture 124 in a two-dimensional direction so that the gas 122 will be blown from the aperture 124 toward all the adsorption portions 112.

It is preferred that the force supply unit 120 blows a blast of gas to the adsorption portions 112. Thus, a relatively large force can be applied to the conductive members 100 by blowing the gas 122 under a relatively lower pressure.

The force applied from the force supply unit 120 is sufficient to maintain at least one conductive member 100 being the predetermined number adsorbed by one of the adsorption portions 112. In the first embodiment, if one conductive member 100 is being adsorbed by one adsorption portion 112, the force supply unit 120 applies a force sufficient to prevent the adsorbed conductive member 100 from be fallen down from the adsorption portion 112.

Furthermore, the force applied from the force supply unit 120 is sufficient to release at least one (preferably, a remainder of a subtraction between the adsorbed number and the predetermined number) of the adsorbed conductive members 100 when the conductive members 100 adsorbed by one of the adsorption portions 112 exceeds the predetermined number. For example, if two conductive members 100 are being adsorbed by one adsorption portion 112, the force supply unit 120 will apply a force sufficient to remove one of the two conductive members 100.

Figure 5:
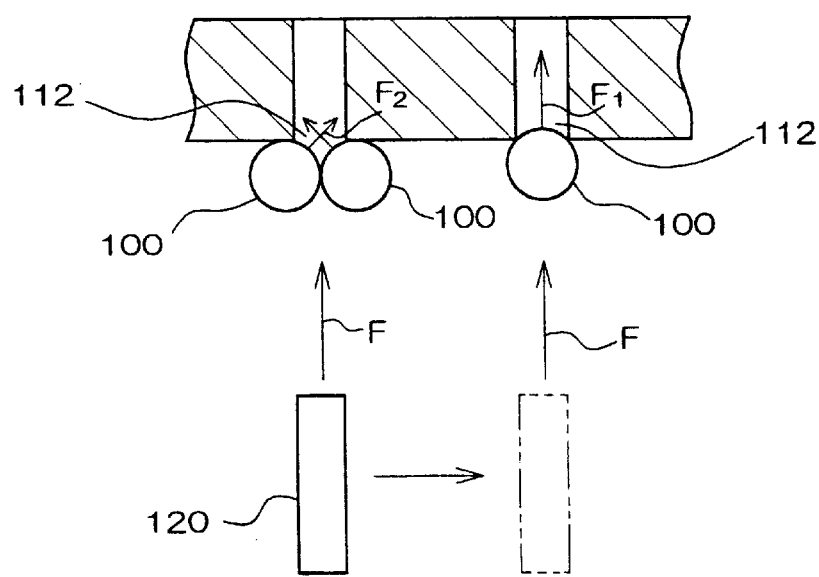
FIG. 5 illustrates a conductive-member adsorbing method according to the first embodiment.

FIG. 5 illustrates forces applied by the force supply unit 120. A direction of adsorption force $F_1$ (or first adsorption direction) when a number of the conductive member 100 adsorbed by one of the adsorption portions 112 is the predetermined number (for example, one) as shown in FIG. 5 on the right-side is different from a direction of adsorption force $F_2$ (or second adsorption direction) when a number of the conductive members 100 (for example, two) adsorbed by one of the adsorption portions 112 exceeds the predetermined number as shown in FIG. 5 on the left-side. In addition, the force $F_1$ is larger than $F_2$.

The force supply unit 120 applies a force F substantially in the same direction as the direction of adsorption force $F_1$ (or first adsorption direction). In such a case, as shown in FIG. 5 on the right side, no conductive member 100 will be removed if one conductive member 100 is being adsorbed by one adsorption portion 112.

On the other hand, as shown in FIG. 5 on the left side, the force supply unit 120 applies the force F in a direction different from the direction of adsorption force $F_2$ (or second adsorption direction). In such a case, at least one of the conductive members 100 can be removed. More particularly, all the conductive members 100 may be removed from the one adsorption portion 112. In the first embodiment, only one of the two conductive members 100 may be removed with the other remaining conductive member 100 being adsorbed by the adsorption portion 112 in the direction of adsorption force $F_1$ (or first adsorption direction).

The present invention also provides a conductive-member adsorbing method, comprising the steps of causing a plurality of adsorption portions 112 to adsorb a plurality of conductive members 100 and applying a force to the adsorbed conductive members to remove excessive conductive members from the adsorption portions 112. The force applied to the conductive members 100 is sufficient to maintain at least one conductive member 100 being the predetermined number adsorbed by one of the adsorption portions 112. The force applied to the conductive members 100 is also sufficient to release at least one of the conductive members 100 when a number of the conductive members adsorbed by one of the adsorption portions 112 exceeds the predetermined number.

Through the aforementioned steps, only one conductive member 100 can be adsorbed by one of the adsorption portions 112. While one conductive member 100 is being adsorbed by one adsorption portion 112, excessive conductive members 100 adsorbed by the other adsorption portions 112 can be removed. Therefore, it is not required that all the conductive members 100 are removed when a number of the conductive members 100 adsorbed by one of the adsorption portions 112 exceeds the predetermined number. This provides an efficient adsorption.

According to the first embodiment, the floating of the conductive members 100 in the container 130 is so set that the double-ball state may easily occur, but the missing state may hardly occur. This is because the force supply unit 120 can overcome the double-ball state. The missing and double-ball states occur due to various factors, such as the height of the adsorber 110 (or the distance between the adsorber 110 and the container 130), the level of floating of the conductive members 100, the adsorption force to the conductive members 100 and so on.

For example, the missing state may easily occur if the distance between the adsorber 100 and the container 130 is increased. If this distance is reduced, the double-ball state may easily occur. If the level of floating of the conductive members 100 is too high (or the amount of supplied gas is too much), the missing and double-ball states tend to occur. If the level of floating of the conductive members 100 is too low (or the amount of supplied gas being too less), the missing state tends to occur.

In the first embodiment, therefore, it is desirable that the distance between the adsorber 110 and the container 130 is smaller while the level of floating of the conductive members 100 is reduced to a certain degree (or the amount of supplied gas being reduced to a certain degree). If the amount of supplied gas is too much, both the missing and double-ball states may occur. The amount of supplied gas must be suppressed so that the missing state will not occur.

Figure 6:
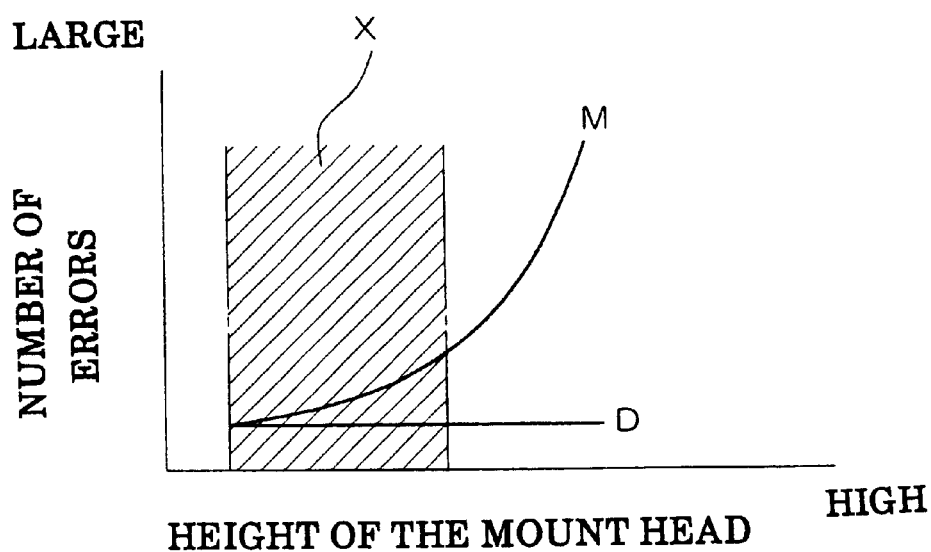
FIG. 6 illustrates a conductive-member adsorbing method according to the first embodiment.
Figure 26:
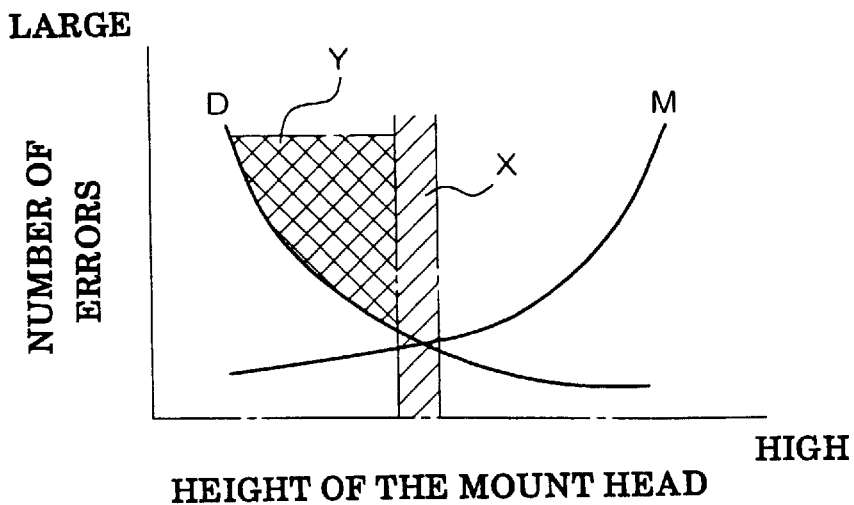
FIG. 26 illustrates a solder-ball adsorbing method according to the prior art.

According to the method of the first embodiment, the number of errors when the height of the adsorber 110 is considered is as shown in FIG. 6. A single-hatched section (X) illustrating a reduced number of errors (or production margin) is extremely larger than that of the prior art. In other words, a double-hatched section (Y) of FIG. 26 in which the adsorption should not be performed will be capable of being used by the present invention. This enables the mounting of solder balls to be performed more effectively.

The conductive members 100 removed by the force supply unit 120 from the adsorption portions 112 in the adsorber 110 are collected into a container 140 shown in FIG. 1.

Subsequently, the detection of the missing and double-ball states is performed. As shown in FIG. 1, for example, the adsorber 110 may be moved above a lamp 142 through any suitable moving means (not shown). The lamp 142 then emits light toward the adsorption portions 112. The adsorber 110 includes a photosensor (not shown) such as light receiving element. When the light passed through the adsorption portions or through-holes 112 is sensed, this shows the occurrence of missing state. In this case, the adsorber 110 is moved back to above the container 130 containing the conductive members 100. The adsorption of conductive members 110 will again be performed.

More particularly, after the step of removing excessive conductive members 100 from the adsorption portions 112, the step of causing the adsorption portions 112 to adsorb the conductive members 100 is repeated if the number of conductive members adsorbed by the adsorption portions 112 is improper. Thus, a proper number of conductive members 100 can be adsorbed by the adsorber 110. On re-adsorbing, it is only required that at least one conductive member 100 being the predetermined number are adsorbed by any adsorption portion 112 placed in the missing state without release of all the adsorbed conductive members at the adsorber 110. However, all the adsorbed conductive members may be released, if desired.

A light-emitting unit 144 is designed to emit a laser beam slightly below the adsorbed conductive members 100. The emitted laser beam is then received by a light-receiving unit 146. If a number of the conductive members 100 adsorbed by one of the adsorption portions 112 exceeds the predetermined number, the laser beam will not be blocked by excessive conductive members and received by the light receiving unit 146. Therefore, it can be judged that the double-ball state occurs. In the first embodiment, however, this sensor arrangement may be omitted in the present invention since the force supply unit 120 is used to prevent the occurrence of double-ball state.

Figure 7:
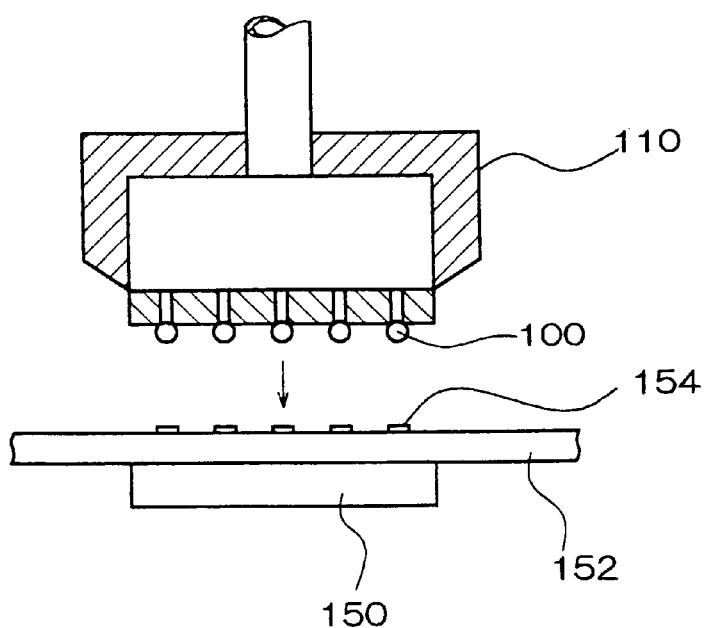
FIG. 7 illustrates a process of mounting the conductive members according to the first embodiment.

The adsorber 110 is then moved to a mounting stage 148 wherein the adsorbed conductive members 100 will be mounted on an object. FIG. 7 shows an example wherein the conductive-member mounting device according to the present invention is embodied to produce a semiconductor device. In FIG. 7, a semiconductor chip 150 is mounted on a substrate 152. The substrate 152 includes wiring patterns 154 formed thereon. The conductive members (or solder balls) 100 will be mounted on the wiring patterns 154. It is frequent that the wiring patterns 154 include lands formed therein, the conductive members 100 being mounted on the respective lands. Through this process, the semiconductor device will be produced.

Figure 8:
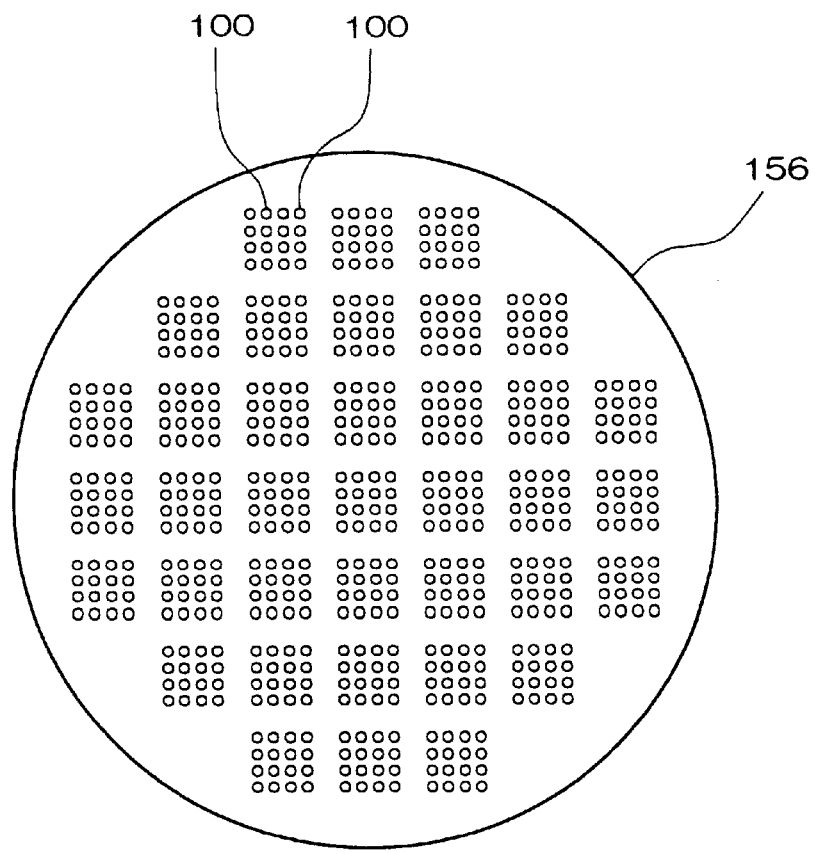
FIG. 8 illustrates a process of mounting the conductive members according to the first embodiment.

Alternatively, as shown in FIG. 8, the conductive members 100 may be mounted on a semiconductor wafer 156. The semiconductor wafer 156 on which the conductive members 100 have been mounted is then die cut to provide a plurality of individual semiconductor devices.

Figure 9:
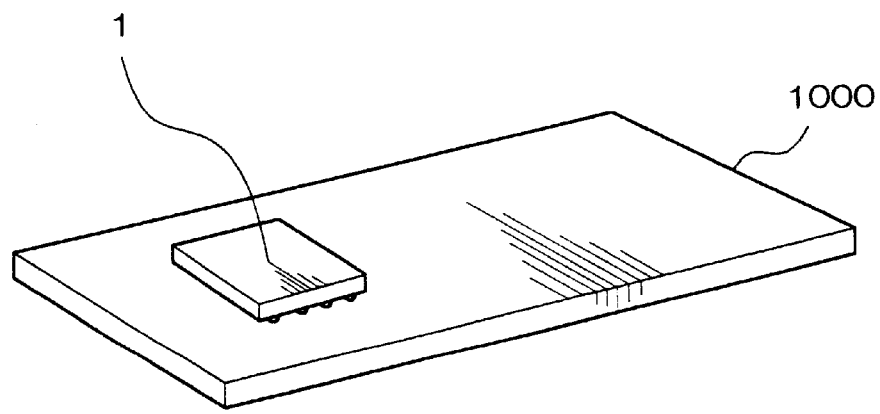
FIG. 9 illustrates a circuit board on which a semiconductor device according to the first embodiment is mounted.

FIG. 9 shows a circuit board 1000 on which a semiconductor device 1 including the solder balls mounted thereon through the aforementioned process is mounted. In general, the circuit board 1000 may be formed by an organic board such as glass-epoxy board. The circuit board 1000 includes wiring patterns of copper or the like to provide a desired circuitry. The wiring patterns are mechanically and electrically connected to the external terminals in the semiconductor device 1.

Figure 10:
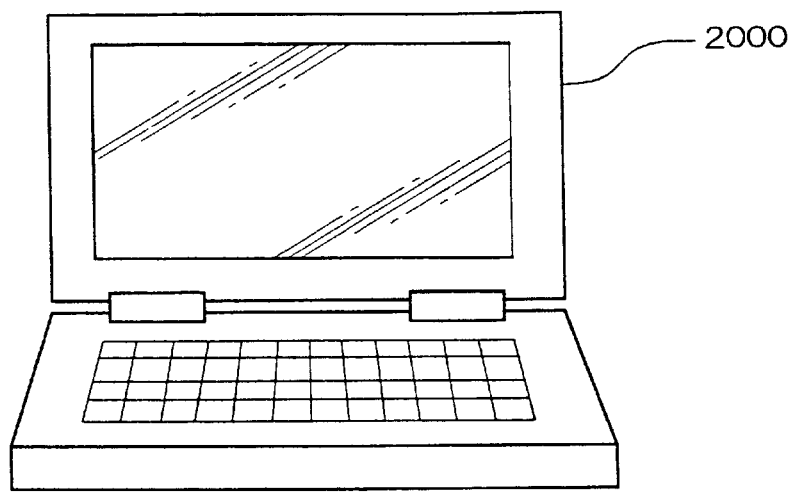
FIG. 10 illustrates an electronic instrument having the semiconductor device according to the first embodiment.
Figure 11:
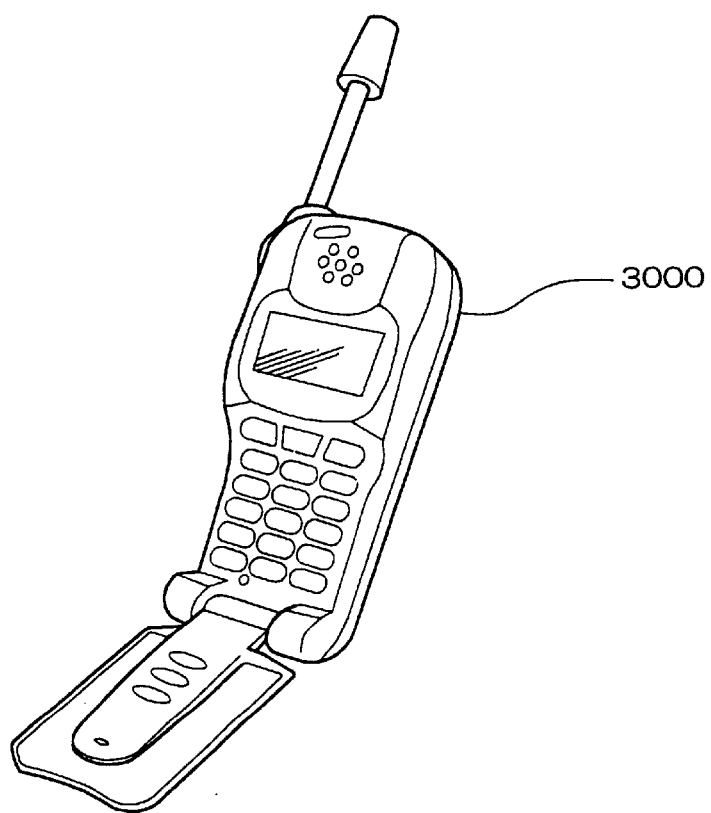
FIG. 11 illustrates an electronic instrument having the semiconductor device according to the first embodiment.

FIG. 10 shows a note-type personal computer 2000 while FIG. 11 shows a portable telephone 3000. Each of these electronic instruments includes a semiconductor device 11 constructed according to the present invention.

The "semiconductor chip" in the aforementioned embodiment may be replaced by an "electronic component" of active or passive type on which the conductive members 100 have been mounted in the manner similar to that of the first embodiment. Electronic parts constructed by such electronic components may include photo-elements, resistors, capacitors, coils, oscillators, filters, temperature sensors, thermistors, varistors, volumes, fuses and so on.

The present invention is not limited to the first embodiment, but may be carried out in any one of various other forms. Other embodiments of the present invention will be described below.

Second Embodiment

FIG. 12 illustrates the second embodiment of the present invention in which such an adsorber 110 as described in connection with the first embodiment is used and such a force supply unit 160 as shown in FIG. 12 is also used. The other structures and functions are similar to those of the first embodiment.

FIG. 13 shows the force supply unit 160 which is designed to apply a force to the conductive members 100 adsorbed by the adsorption portions 112. The force supply unit 160 shown in FIG. 13 has a brush 162 utilized as a contacting portion to the conductive members 100. The brush 162 is preferably formed of any flexible material. The brush 162 may be replaced by a thin sheet of metal or resin.

In order to prevent any electrostatic adsorption of the conductive members 100, the force supply unit 160 is preferably brought into contact with the conductive members 100 without charge of the static electricity. To this end, the brush 162 may be a carbon brush. Alternatively, the force supply unit 160 may be configured to remove the static electricity from the contact between the brush and the conductive members 100.

As shown in FIG. 12, it is preferred that the force supply unit 160 only contacts the tips of the conductive members 100 opposite to the adsorption portions 110 (or the bottoms thereof as viewed in FIG. 12). The level of the contacting portion (e.g., the brush 162) in the force supply unit 160 may be adjusted through any suitable means. For example, if two conductive members 100 are adsorbed by one adsorption portion 112, the level of the brush 162 is adjusted so that it rubs the conductive members 100. If one conductive member 100 is being adsorbed by one adsorption portion 112, the level of the brush 162 is adjusted so that it will not be brought into contact with the conductive members 100. If the level of the brush can exactly be controlled, the flexible or resilient member such as the brush 162 may be replaced by any suitable hard member such as a metal sheet.

The second embodiment may also overcome the problem of double-ball state, as in the first embodiment.

Third Embodiment

Figure 14:
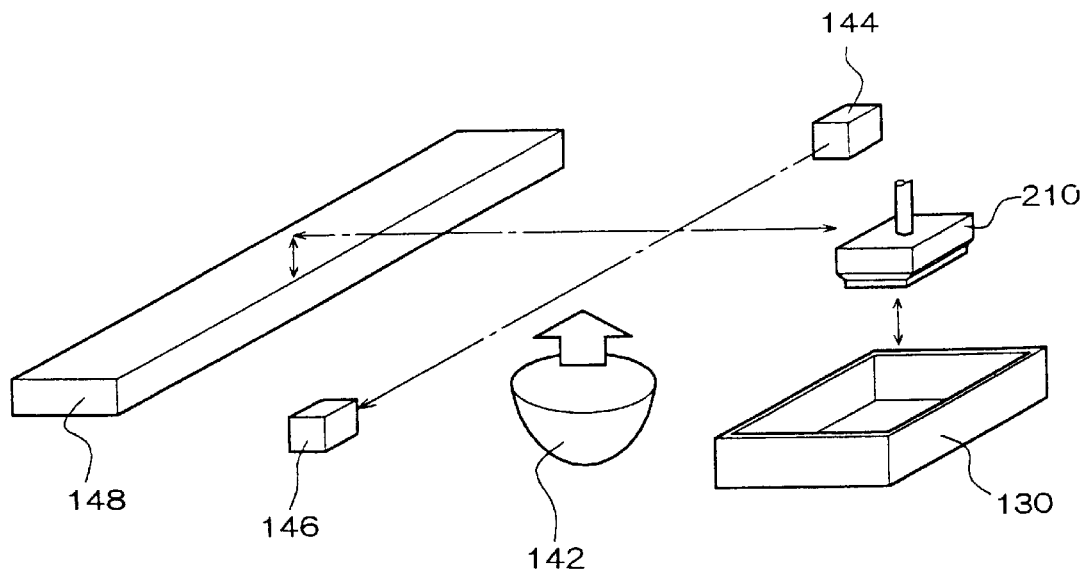
FIG. 14 illustrates a conductive-member mounting device according to a third embodiment of the present invention.

FIG. 14 illustrates a conductive-member mounting device constructed according to the third embodiment of the present invention. The conductive-member mounting device comprises an adsorber 210 for adsorbing conductive members. The adsorber 210 has a function of mounting the conductive members on an object and may be thus referred to a "adsorbing/mounting device" (or mount head).

The conductive-member mounting device comprises a container 130, a lamp 142, a light-emitting unit 144, a light receiving unit 146 and a mounting stage 148 as in the first embodiment. The third embodiment also utilizes such conductive members 100 as described in connection with the first embodiment.

In the third embodiment, the adsorber 210 itself is configured to completely eliminate the double-ball state. Therefore, the third embodiment does not use any tool corresponding to the force supply unit 120 described in connection with the first embodiment.

Figure 15:
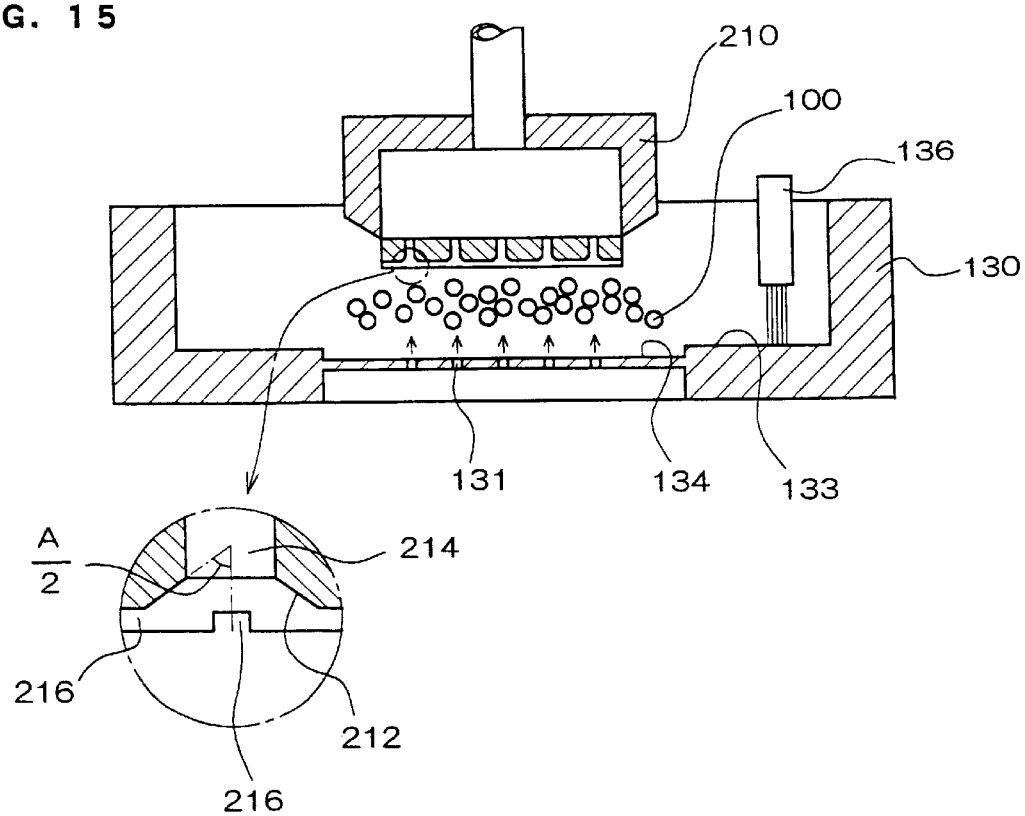
FIG. 15 illustrates a conductive-member adsorber according to the third embodiment.
Figure 16:
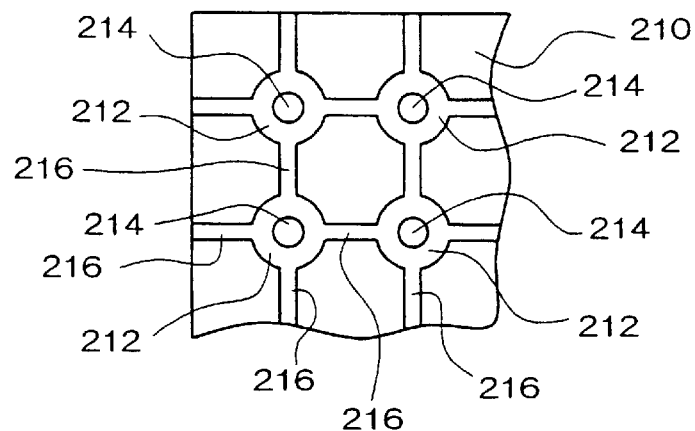
FIG. 16 illustrates a conductive-member adsorber according to the third embodiment.

FIG. 15 is a cross-sectional view of the adsorber 210 which is formed with at least one receiver 212. However, a plurality of receivers 212 is considered in the third embodiment. FIG. 16 is a plan view of the adsorber 210 which is formed with a plurality of receivers 212 arranged in plural rows and columns.

Each of the receivers 212 includes a gas inlet port 214 formed therein which leads to any suitable vacuum source such as a vacuum pump (not shown). When the gas is evacuated through each of the gas inlet port 214, the conductive members 100 will be attracted to and adsorbed by the respective receivers 212. The receivers 212 may be referred to adsorption portions.

Each of the receivers 212 is configured to receive at least one conductive member 100 being the predetermined number to be received by one receiver, to close the corresponding inlet port 214. More particularly, a part of the conductive member 100 is preferably brought into intimate contact with the corresponding receiver 212. Each receiver 212 may have either of a tapered, flat or recessed form. The receiver 212 has an opening larger than the corresponding inlet port 214. Thus, the receiver 212 can easily receive a conductive member 100. If the receiver 212 has a tapered configuration, the angle of taper (A/2) is preferably in the range between about 40 degrees and about 50 degrees.

An uneven portion is formed outside of each of the receivers 212. In the third embodiment, the uneven portion is formed by at least one groove 216 leading to the corresponding receiver 212. However, a plurality of grooves 216 is formed in the third embodiment. It is preferred that a plurality (e.g., four) of grooves 216 is formed outside each of the receivers 212 so that each of the conductive members 100 can easily be received by the grooves. In presence of the uneven portion (i.e., grooves 216), a path of gas flow is formed leading to the corresponding inlet port 214. In the third embodiment, one groove 216 communicates with a plurality (e.g., two) of receivers 212.

Figure 17A:
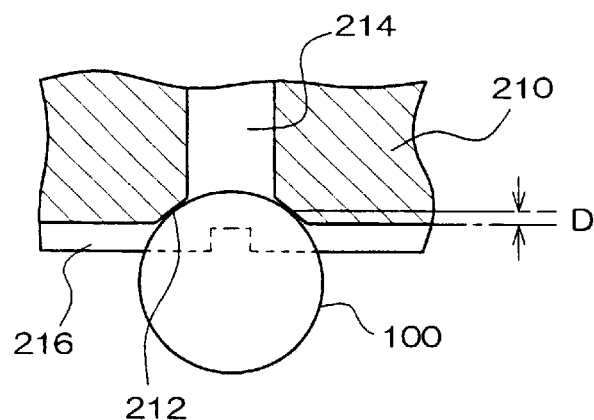
FIGS. 17A and B illustrate a conductive-member adsorbing method according to the third embodiment.
Figure 17B:
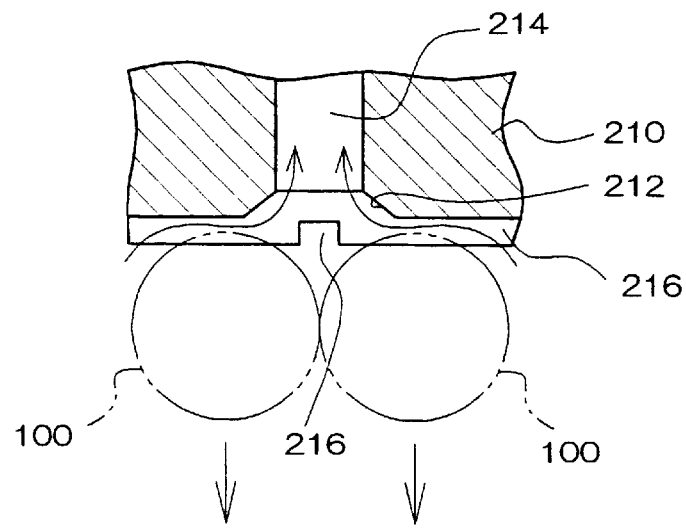

Preferably, each of the grooves 216 is relatively deep, for example, has a depth of about 30 $\mu$m minimum. However, to avoid any leakage of gas when only one conductive member 100 is adsorbed by one receiver 212, it is preferred that a spacing D is between the bottom of the groove 216 and the contact area between the conductive member 100 and the receiver 212, as shown in FIG. 17A. In other words, each of the grooves 216 is preferably of a depth smaller than that of the contact area between the conductive member 100 and the receiver 212.

Each of the grooves 216 is also preferably configured such that a conductive member 100 will not be brought into contact with the bottom of a groove 216 even if a portion of the conductive member is received by the groove 216. Thus, the grooves 216 can be prevented from being closed by the conductive members 100 in the double-ball state. For example, it may be preferred that the distance between a portion of each conductive member 100 received by one groove 216 and the bottom of that groove 216 is maintained to be about 30 $\mu$m FIGS. 17A and B illustrate a process of adsorbing the conductive members. If only one conductive member 100 is adsorbed by one receiver 212 as shown in FIG. 17A, the inlet port 214 is closed by that conductive member 100. This prevents the leakage of gas into that inlet port 214. As a result, the inside of the inlet port 214 is in vacuum and the conductive member 100 will more strongly be attracted to the inlet port 214.

On the other hand, if two conductive members 100 are attracted to one receiver 212, the grooves 216 form a path of gas flow below the conductive members 100. As a result, the conductive members 100 will not be adsorbed toward the inlet port 214 due to the leakage of gas.

According to the third embodiment, the conductive member 100 can positively be adsorbed by the receiver 212 when the inside of the inlet port 214 is in vacuum. Since an uneven portion is formed by the grooves 216 outside of the receiver 212, the path of gas flow is formed below the conductive members 100 even a certain number of conductive members 100 are attracted around one receiver 212. Thus, the gas can pass through this path of gas flow. This makes the adsorbing of conductive members difficult. In such a manner, the conductive member received in the receiver 212 can be adsorbed, but the conductive members attracted outside the receiver 212 will not be adsorbed. In other words, a number of the conductive members 100 adsorbed by one receiver 212 will not exceed the predetermined number. Therefore, it is not required that all the adsorbed conductive members 100 are released if a proper number of conductive members are not adsorbed by the adsorber, as in the prior art. This provides an effective adsorption.

The other structures and functions of the third embodiment are similar to those of the first embodiment except that the force supply unit 120 and associated matters are omitted. Therefore, a further description will not be made.

Figure 18A:
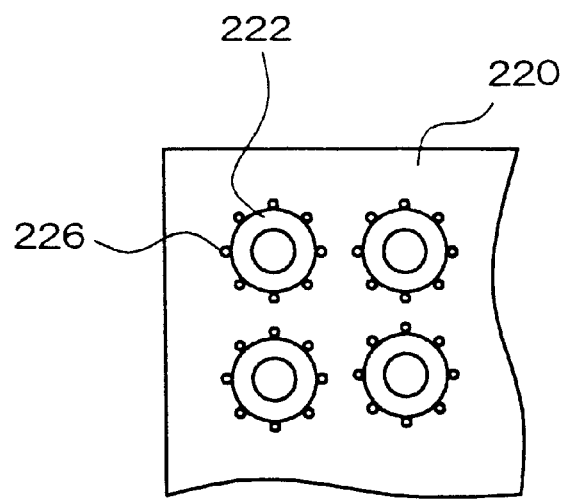
FIGS. 18A and B illustrate a modification of the third embodiment.
Figure 18B:
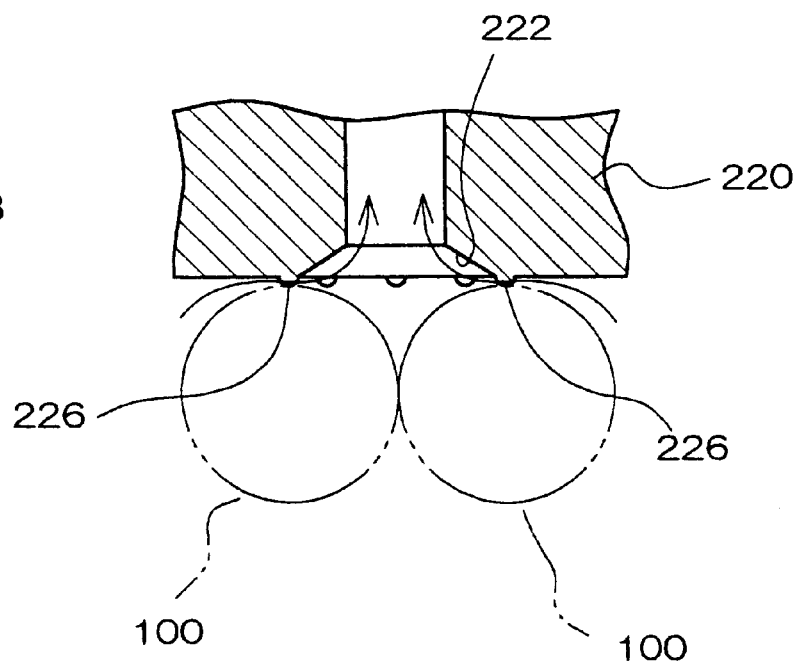

FIGS. 18A and B shows a modification of the third embodiment. In such a modification, an adsorber 220 includes at least one projection 226 (or preferably two or more projections 226) formed around the outer periphery of a receiver 222. The projection or projections 226 forms or form an uneven portion. When the conductive members 100 are brought into contact with the projection or projections 226, a path of gas flow will be formed below the conductive members 100. The other structures and functions are similar to those of the third embodiment.

Figure 19:
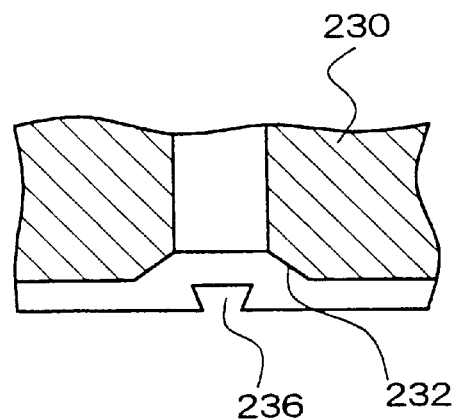
FIG. 19 illustrates another modification of the third embodiment.

FIG. 19 shows another modification of the third embodiment. In this modification, an adsorber 230 includes receivers 232 each of which has a groove 236 formed therein. The groove 236 has an opening smaller than the bottom thereof. Such a configuration of the groove 236 can cause more gas to leak. The other structures and functions are similar to those of the third embodiment.

Figure 20:
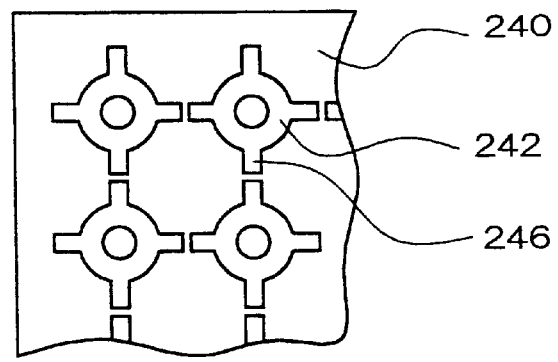
FIG. 20 illustrates still another modification of the third embodiment.

FIG. 20 shows still another modification of the third embodiment. Although each of the grooves 216 leads to a plurality of receivers 212 in the third embodiment, the still another modification provides an adsorber 240 which includes grooves 246 formed therein, each of the grooves 246 leading to only one receiver 242. The other structures and functions are similar to those of the third embodiment.

Figure 21:
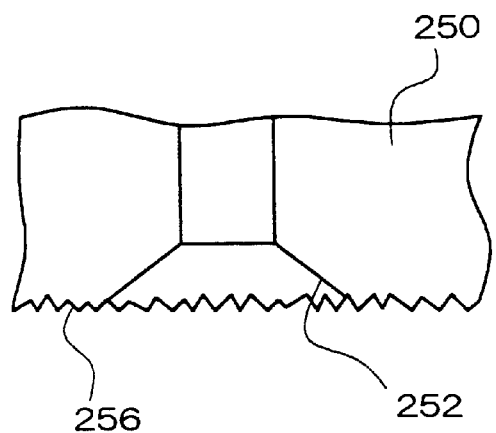
FIG. 21 illustrates a further modification of the third embodiment.

FIG. 21 shows a further modification of the third embodiment. In the further modification, an adsorber 250 includes receivers 252. The surface of the adsorber 250 in which the receivers 252 are formed is roughened to provide an uneven portion for causing the gas to leak. The other structures and functions are similar to those of the third embodiment.

Fourth Embodiment

Figure 22:
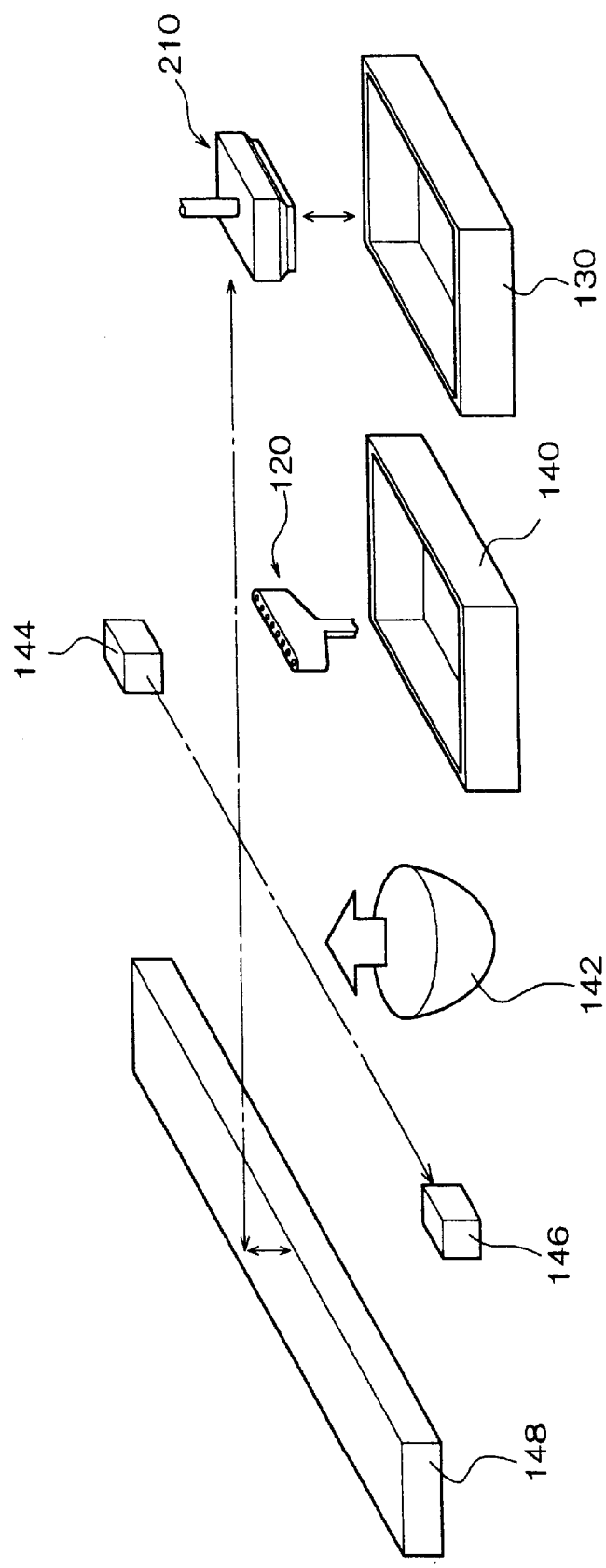
FIG. 22 illustrates a conductive-member mounting device according to a fourth embodiment of the present invention.
Figure 23:
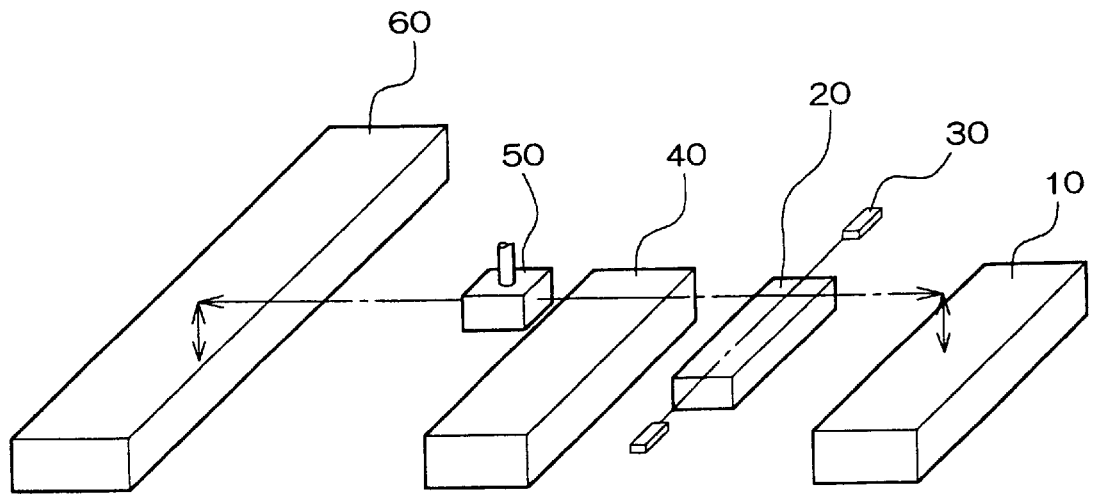
FIG. 23 illustrates a solder-ball mounting device according to the prior art.
Figure 24:
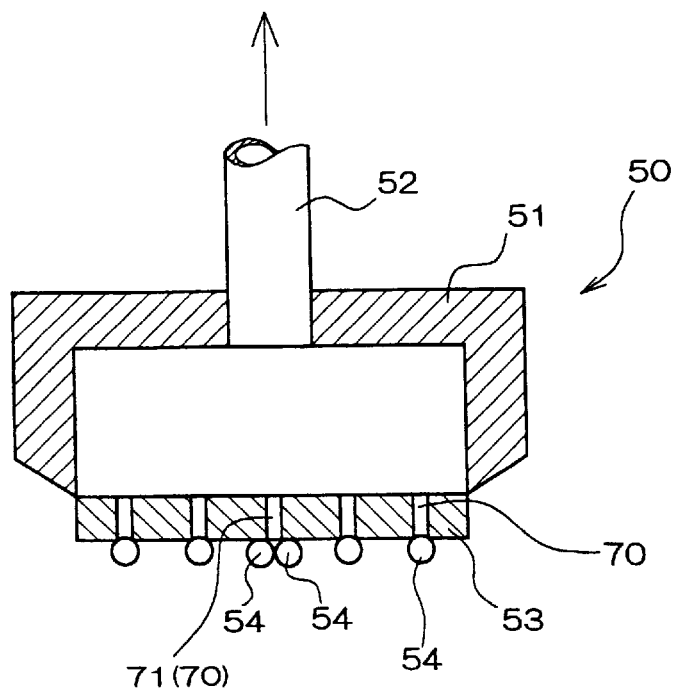
FIG. 24 illustrates a mount head according to the prior art.
Figure 25:
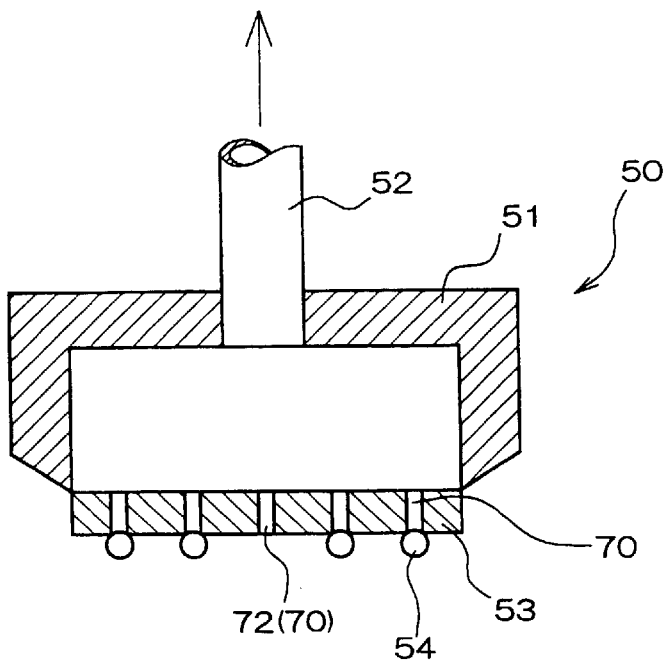
FIG. 25 illustrates a mount head according to the prior art.

FIG. 22 illustrates a conductive-member mounting device according to the fourth embodiment. The conductive-member mounting device includes the adsorber 210 (see FIG. 15) described in connection with the third embodiment in place of the adsorber 110 in the conductive-member mounting device (see FIG. 1) described in connection with the first embodiment. Therefore, a further description will not be made. It is to be understood that the present invention can also include such a form.

What is claimed is:

1. A conductive-member adsorbing method, comprising a step of adsorbing a plurality of conductive members by a plurality of adsorption portions and applying a force to the adsorbed conductive members to remove at least one of the conductive members which exceeds a predetermined number to be adsorbed by each of the adsorption portions, wherein the force is capable of maintaining an adsorbed state of the predetermined number of the conductive member to be adsorbed by each of the adsorption portions, and capable of releasing at least one of the conductive members when a number of the conductive members adsorbed by one of the adsorption portions exceeds the predetermined number;

wherein each of the adsorption portions adsorbs at least one of the conductive members without exceeding the predetermined number; and wherein the force is applied in a substantially same direction as the direction in which the predetermined number of the conductive member is adsorbed by one of the adsorption portions.

2. The conductive-member adsorbing method as defined in claim 1,
wherein after the step of removing the at least one exceeded conductive member, the step of adsorbing a plurality of conductive members by a plurality of adsorption portions is repeated when a number of the adsorbed conductive members by each of the adsorption portions is smaller than the predetermined number.

3. A conductive-member mounting method, comprising a step of adsorbing the conductive members according to the method as defined in claim 1 and mounting the adsorbed conductive members on an object.

4. A method of making a semiconductor device, comprising a step of adsorbing the conductive members according to the method as defined in claim 1 and mounting the adsorbed conductive members on a component.

5. A semiconductor device manufactured according to the method as defined in claim 4.

6. A conductive-member adsorbing method, comprising adsorbing at least one conductive member by a receiver having an inlet port for gas, the receiver being formed to receive the conductive member that is a predetermined number to be received by the receiver,
wherein an uneven portion is formed around outside the receiver;
wherein when the conductive member disposed within the receiver prevents the gas from leaking into the inlet port, a negative pressure is created within the inlet port, thus adsorbing the disposed conductive member; and
wherein when the gas is leaked to an under portion of the conductive member through the uneven portion, outside the receiver, the conductive member is prevented from being adsorbed.

7. A conductive-member mounting method, comprising a step of adsorbing the conductive members according to the method as defined in claim 6 and mounting the adsorbed conductive members on an object.

8. A method of making a semiconductor device, comprising a step of adsorbing the conductive members according to the method as defined in claim 6 and mounting the adsorbed conductive members on a component.

9. A semiconductor device manufactured according to the method of claim 8.

* * * * *